United States Patent
Ueda et al.

[11] Patent Number: 5,994,935
[45] Date of Patent: Nov. 30, 1999

[54] LATCH CIRCUIT AND FLIP-FLOP CIRCUIT REDUCED IN POWER CONSUMPTION

[75] Inventors: Kimio Ueda; Koichiro Mashiko; Yoshiki Wada, all of Hyogo, Japan

[73] Assignee: Mitsubishi Denki Kabushiki Kaisha, Tokyo, Japan

[21] Appl. No.: 09/130,607

[22] Filed: Aug. 7, 1998

[30] Foreign Application Priority Data

Jan. 27, 1998 [JP] Japan .................................. 10-014217

[51] Int. Cl.[6] .......................... H03K 3/037; H03K 3/356
[52] U.S. Cl. ............................................. 327/202; 327/203
[58] Field of Search ..................................... 327/199, 200, 327/201, 202, 203, 208, 209, 210, 211, 212, 218

[56] References Cited

U.S. PATENT DOCUMENTS 5,391,935 2/1995 Gersbach et al. ....................... 327/198
5,789,956 8/1998 Mahant-Shetti et al. ............... 327/202

FOREIGN PATENT DOCUMENTS 1-248820 10/1989 Japan .................................... 327/218

OTHER PUBLICATIONS

"3–Gb/s CMOS 1:4 MUX and DEMUX ICs", Yasuda et al., IEICE Transactions on Electronics, vol. E78–C, No. 12, Dec. 1995, pp. 1746–1753.

*Primary Examiner*—Tuan T. Lam
*Attorney, Agent, or Firm*—McDermott, Will & Emery

[57] ABSTRACT

A flip-flop circuit is constituted of two latch circuits of the same structure that are cascaded. The latch circuits each includes an inverter formed of a P channel transistor and an N channel transistor, an N channel transistor connected between a common node and a ground node, and two data input/output terminals. Two kinds of clock signals supplied to gates of N channel transistors are complementary to each other.

11 Claims, 11 Drawing Sheets

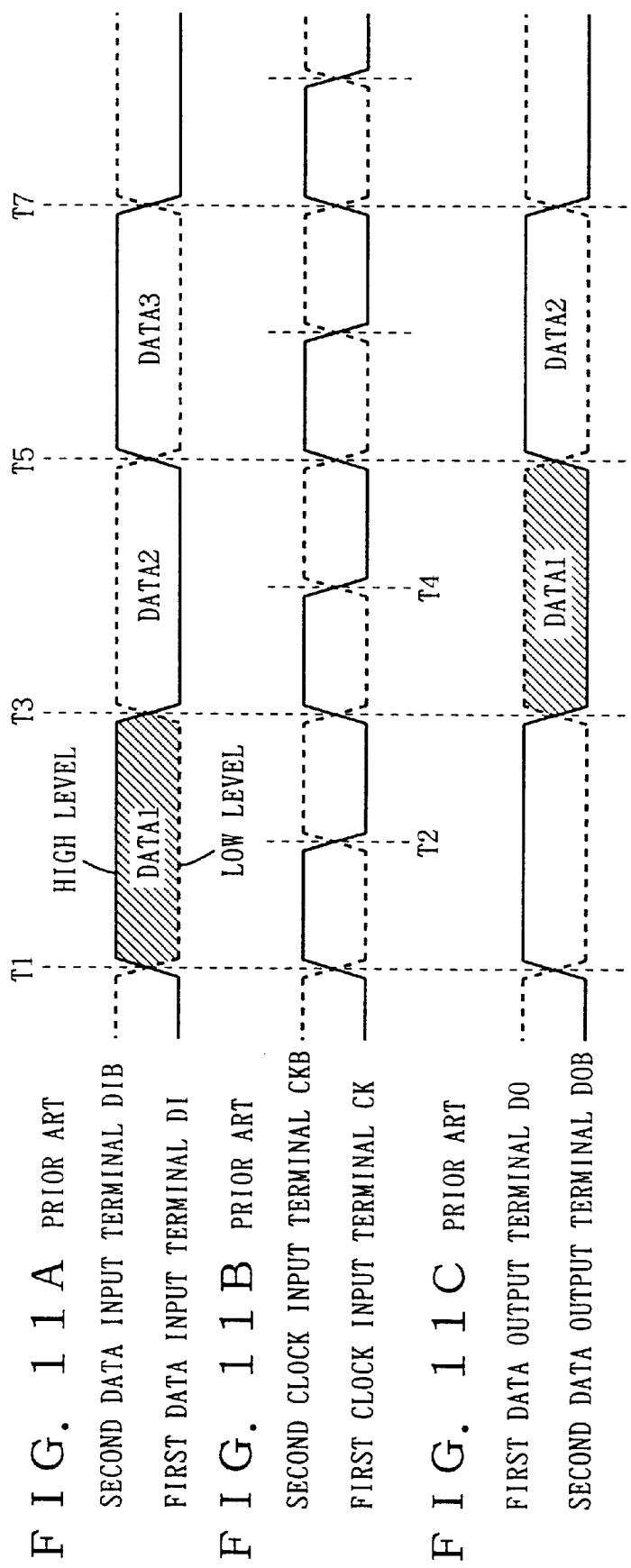

F I G. 1 2  PRIOR ART
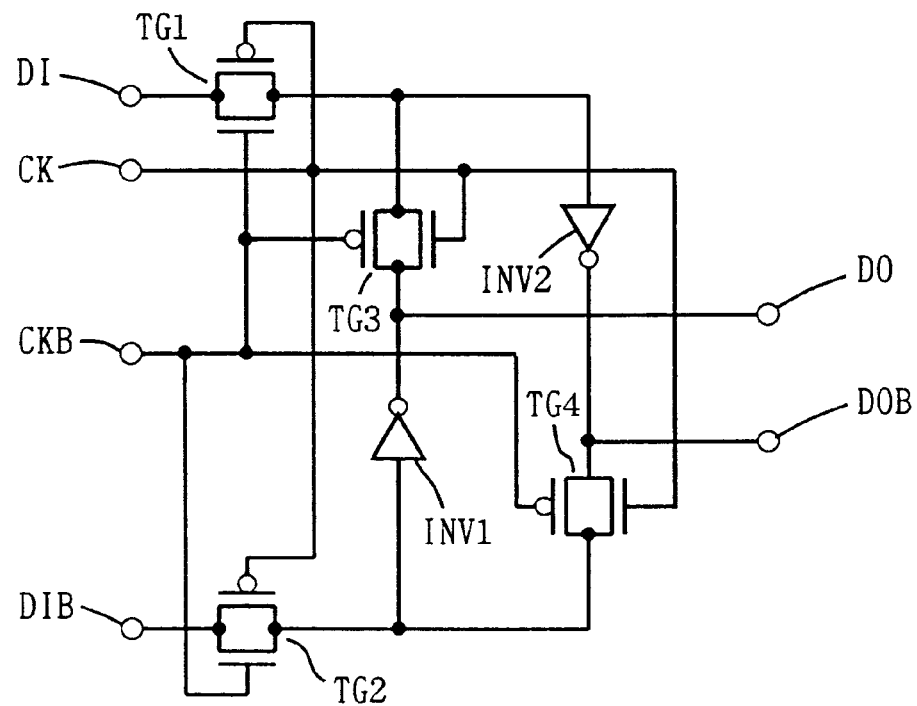
F I G. 1 4  PRIOR ART
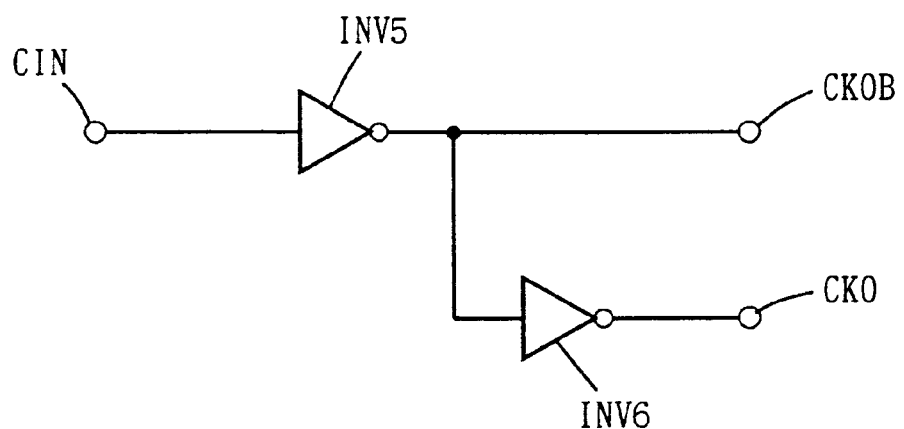

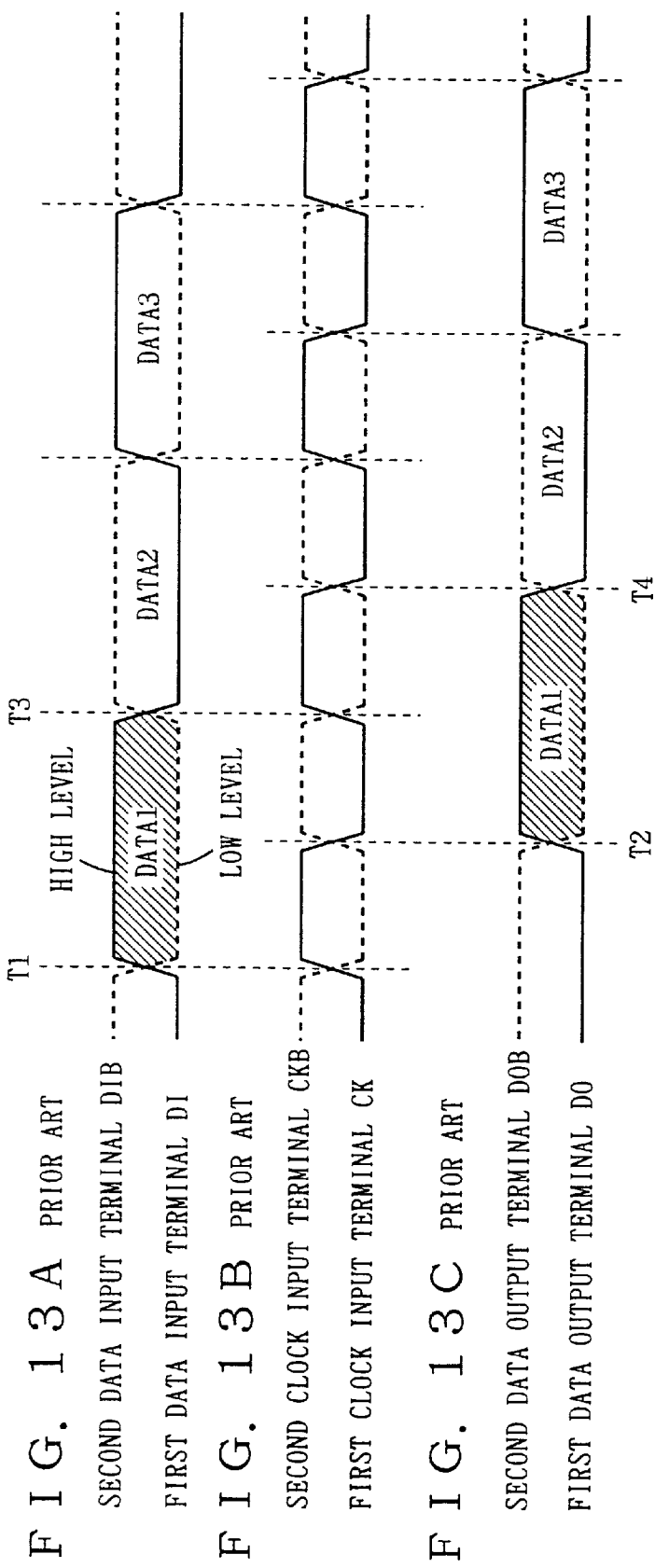

LATCH CIRCUIT AND FLIP-FLOP CIRCUIT REDUCED IN POWER CONSUMPTION

BACKGROUND OF THE INVENTION

1. Field of the Invention

The present invention relates to a semiconductor integrated circuit, and particularly to a latch circuit and a flip-flop circuit retaining data.

2. Description of the Background Art

FIG. 9 is a circuit diagram showing a structure of a conventional flip-flop circuit described in IEICE TRANSACTIONS on Electronics, vol. E78-C, No. 12, December 1995, pp. 1746–1753.

Referring to FIG. 9, the flip-flop circuit includes transmission gates TG1–TG8, inverter gates INV1–INV4, a first data input terminal DI, a second data input terminal DIB, a first clock input terminal CK, a second clock input terminal CKB, a first data output terminal DO, and a second data output terminal DOB. Each of the transmission gates TG1–TG8 is constructed of a set of P channel MOS transistor and N channel MOS transistor connected in parallel.

FIG. 10 is a circuit diagram showing a structure of each of the inverter gates INV1–INV4 shown in FIG. 9. As shown in FIG. 10, the inverter gate includes a supply voltage node VDD, a data input terminal IN, a data output terminal OUT, a P channel MOS transistor connected between supply voltage node VDD and data output terminal OUT and having its gate connected to data input terminal IN, a ground node, and an N channel MOS transistor connected between the ground node and data output terminal OUT and having its gate connected to data input terminal IN.

The inverter gate outputs, data at a high level (supply voltage) if data supplied to data input terminal IN is less than a logic threshold voltage of the inverter gate (generally an intermediate voltage between supply voltage and ground voltage), and data at a low level (ground voltage) if data supplied to data input terminal IN is more than the logic threshold voltage of the inverter gate, to data output terminal OUT.

An operation of the flip-flop circuit shown in FIG. 9 is next described referring to timing charts of FIGS. 11A–11C.

At time T1, a signal at the high level is applied to the first data input terminal DI, and a signal at the low level is applied to the second data input terminal DIB. Those signals applied to the first and second data input terminals DI and DIB are here supposed to be first data DATA1. At this time, when a signal at the high level and a signal at the low level are respectively supplied to the first and second clock input terminals CK and CKB, transmission gates TG1 and TG2 are turned off and transmission gates TG3–TG6 are turned on. Transmission gates TG7 and TG8 are turned off.

At time T2, if the signal supplied to the first clock input terminal CK goes down to the low level, and the signal supplied to the second clock input terminal CKB attains the high level, transmission gates TG1 and TG2 are turned on, an output from inverter gate INV2 is set to the low level by the high level signal supplied to the first data input terminal DI, and an output from inverter gate INV1 is set to the high level by the low level signal supplied to the second data input terminal DIB. At this time, transmission gates TG3–TG6 are turned off and transmission gates TG7 and TG8 are turned on.

At time T3, the signal supplied to the first data input terminal DI goes down to the low level, and the signal supplied to the second data input terminal DIB goes up to the high level. These signals are here supposed to be second data DATA2. Simultaneously, the signal supplied to the first clock input terminal CK attains the high level and the signal supplied to the second clock input terminal CKB goes down to the low level at time T3. Consequently, the second data DATA2 applied to the first and second data input terminals DI and DIB is separated from an internal circuit since transmission gates TG1 and TG2 are turned off. At this time, transmission gates TG3 and TG4 are turned on, the low level signal output from inverter gate INV2 is supplied to inverter gate INV1 via transmission gate TG4, and the high level signal output from inverter gate INV1 is supplied to inverter gate INV2 via transmission gate TG3. Consequently, the first data DATA1 supplied to the first and second data input terminals DI and DIB is retained by a closed loop latch circuit constituted of inverter gate INV1, transmission gate TG3, inverter gate INV2, and transmission gate TG4. Since transmission gates TG5 and TG6 are also turned on at this time, an output signal of inverter gate INV1 is supplied to inverter gate INV4 via transmission gate TG5, and an output signal of inverter gate INV2 is supplied to inverter gate INV3 via transmission gate TG6.

As a result, the first and second data output terminals DO and DOB output the first data DATA1 at time T3.

At time T4, when the signal supplied to the first clock input terminal CK goes down to the low level and the signal supplied to the second clock input terminal CKB attains the high level, transmission gates TG1 and TG2 are turned on. Consequently, transmission gates TG1 and TG2 set the output node of inverter gate INV1 to the low level, and the output node of inverter gate INV2 to the high level. The second data DATA2 is thus taken. At this time, transmission gates TG3–TG6 are turned off and transmission gates TG7 and TG8 are turned on. Accordingly, the first and second data output terminals DO and DOB continuously output the first data DATA1, while the first data DATA1 is retained by a closed loop latch circuit constituted of inverter gate INV3, transmission gate TG7, inverter gate INV4 and transmission gate TG8.

The flip-flop circuit shown in FIG. 9 has a function, as described above, of receiving data signals supplied to the first and second data input terminals DI and DIB in synchronism with clock signals applied to the first and second clock input terminals CK and CKB, temporarily retaining the data signals, and outputting the data signals from the first and second data output terminals with phase therebetween shifted.

According to the description above, the signal supplied to the first data input terminal DI changes its state from the high level to the low level, and the signal changing its state from the low level to the high level is supplied to the second data input terminal DIB to which an inverted signal of the signal applied to the first data input terminal DI is supplied (an operation from the time T1 to the time T5). However, the flip-flop circuit similarly operates from the time T5 to the time T7 regardless of change in signal level.

FIG. 12 is a circuit diagram illustrating a structure of a conventional latch circuit. The flip-flop circuit shown in FIG. 9 is structured by serially connecting such latch circuits in two stages. As shown in FIG. 12, the latch circuit includes transmission gates TG1–TG4, inverter gates INV1 and INV2, a first data input terminal DI, a second data input terminal DIB, a first clock input terminal CK, a second clock input terminal CKB, a first data output terminal DO, and a second data output terminal DOB.

An operation of the latch circuit is described referring to timing charts of FIGS. 13A–13C. Referring to FIG. 13A, at time T1, a high level signal is supplied to the first data input terminal DI, and a low level signal is supplied to the second data input terminal DIB. The signals supplied to the first and second data input terminals DI and DIB are herein supposed to be first data DATA1. At this time, if a high level signal is supplied to the first clock input terminal CK and a low level signal is supplied to the second clock input terminal CKB, transmission gates TG1 and TG2 are turned off and transmission gates TG3 and TG4 are turned on.

Referring to FIG. 13B, at time T2, if the signal applied to the first clock input terminal CK goes down to the low level and the signal supplied to the second clock input terminal CKB goes up to the high level, transmission gates TG1 and TG2 are turned on, the high level signal applied to the first data input terminal DI allows an output node of inverter gate INV2 or the second data output terminal DOB to have voltage at the low level, and the low level signal supplied to the second data input terminal DIB allows an output node of inverter gate INV1 or the first data output terminal DO to have voltage at the high level. Accordingly, the first and second data output terminals DO and DOB output the first data DATA1 as shown in FIG. 13C. At this time, transmission gates TG3 and TG4 are turned off.

As shown in FIG. 13A, at time T3, the signal supplied to the first data input terminal DI goes down to the low level and the signal supplied to the second data input terminal DIB goes up to the high level. The signals applied to the first and second data input terminals DI and DIB are herein supposed to be second data DATA2. At time T3, as shown in FIG. 13B, the signal supplied to the first clock input terminal CK attains the high level and the signal supplied to the second clock input terminal CKB goes down to the low level. Consequently, the second data DATA2 supplied to the first and second data input terminals DI and DIB is separated from an internal circuit since transmission gates TG1 and T2 are turned off. At time T3, transmission gates TG3 and TG4 are turned on. Accordingly, a low level signal output from inverter gate INV2 is supplied to inverter gate INV1 via transmission gate TG4, and a high level signal output from inverter gate INV1 is supplied to inverter gate INV2 via transmission gate TG3. As a result, a closed loop latch circuit constituted of inverter gate INV1, transmission gate TG3, inverter gate INV2 and transmission gate TG4 latches the first data DATA1 supplied to the first and second data input terminals DI and DIB, while the first and second data output terminals DO and DOB continuously output the data.

At time T4, when the signal supplied to the first clock input terminal CK goes down to the low level and the signal supplied to the second clock input terminal CKB goes up to the high level, transmission gates TG1 and TG2 are turned on, the output node of inverter gate INV2 attains the high level, and the output node of inverter gate INV1 goes down to the low level.

Accordingly, a low level signal is output from the first data output terminal DO, and a high level signal is output from the second data output terminal DOB. In other words, the second data DATA2 is output.

The latch circuit has a function of, as described above, receiving data signals supplied to the first and second data input terminals DI and DIB synchronously with clock signals supplied to the first and second clock input terminals CK and CKB, and outputting the data signals from the first and second data output terminals DO and DOB with phase therebetween shifted. According to the description above, the signal supplied to the first data input terminal DI changes its state from the high level to the low level, and the signal changing its state from the low level to the high level is supplied to the second data input terminal DIB to which an inverted signal of the signal supplied to the first data input terminal DI is applied (time T1–time T4). However, the latch circuit similarly operates after time T4.

Both of the flip-flop circuit and the latch circuit described above have a function of receiving the data signals synchronously with the clock signals and outputting them with phase shifted. However, the phase between the data signals output from the latch circuit is shifted, compared with that of the flip-flop circuit, by ½ period of the clock signals.

FIG. 14 shows a structure of a circuit which buffers a clock signal or a data signal supplied to the flip-flop circuit shown in FIG. 9 or the latch circuit shown in FIG. 12. Referring to FIG. 14, the circuit includes a signal input terminal CIN, an inverter gate INV5 connected to signal input terminal CIN, a second output terminal CKOB connected to inverter gate INV5, an inverter gate INV6 connected to inverter gate INV5, and a first output terminal CKO connected to inverter gate INV6.

When a high level signal is applied to signal input terminal CIN, a high level signal is output from the first output terminal CKO via inverter gates INV5 and INV6, and a low level signal is output from the second output terminal CKOB via inverter gate INV5.

When a low level signal is input to signal input terminal CIN, a low level signal is output from the first output terminal CKO, and a high level signal is output from the second output terminal CKOB.

The circuit thus generates two signals complementary to each other based on one input signal. Signals generated by the buffer circuit are respectively supplied to the first data input terminal DI, the second data input terminal DIB, the first clock input terminal CK, and the second clock input terminal CKB of the flip-flop circuit shown in FIG. 9 or the latch circuit shown in FIG. 12. If the buffer circuit is used for the clock signals, the output terminals of the buffer circuit are connected to four P channel MOS transistors and four N channel MOS transistors of the flip-flop circuit, or the output terminals are connected to two P channel MOS transistors and two N channel MOS transistors of the latch circuit.

The flip-flop circuit shown in FIG. 9 has twelve (12) P channel MOS transistors and twelve (12) N channel MOS transistors, and the latch circuit shown in FIG. 12 has six (6) P channel MOS transistors and six (6) N channel MOS transistors. Therefore, a disadvantage thereof is a large occupied area of a circuit.

In addition, when the buffer circuit is used for the clock signals, two output terminals of the buffer circuit are connected to four P channel MOS transistors and four N channel MOS transistors of the flip-flop circuit, or connected to two P channel MOS transistors and two N channel MOS transistors of the latch circuit as described above. Problems in these cases are that a large load capacitance of the output terminal and a highly large power consumed by the buffer circuit used for the clock signals for charging and discharging of the load capacitance.

SUMMARY OF THE INVENTION

An object of the present invention is to provide a latch circuit and a flip-flop circuit reduced in the number of necessary elements and occupied area as well as in power consumption.

According to one aspect of the invention, a latch circuit includes: a common node; a first power supply node; a first inverter operating with both of voltage on the common node and voltage on the first power supply node as operation power supply voltage; a second inverter having its input node connected to an output node of the first inverter, having its output node connected to an input node of the first inverter, and operating with both of voltage on the common node and voltage on the first power supply node as operation power supply voltage; a first data input terminal; a first transistor connected between the first data input terminal and the input node of the first inverter and having its gate to which a first clock signal is supplied; a second data input terminal; a second transistor connected between the second data input terminal and the input node of the second inverter and having its gate to which the first clock signal is supplied; a second power supply node; a third transistor connected between the common node and the second power supply node and having its gate to which a second clock signal which is complementary to the first clock signal is supplied; a first data output terminal connected to the output node of the first inverter; and a second data output terminal connected to the output node of the second inverter.

According to another aspect of the invention, a flip-flop circuit includes a plurality of cascaded latch circuits. Each latch circuit includes: a common node; a first power supply node; a first inverter operating with both of voltage on the common node and voltage on the first power supply node as operation power supply voltage; a second inverter having its input node connected to an output node of the first inverter, having its output node connected to an input node of the first inverter, and operating with both of voltage on the common node and voltage on the first power supply node as operation power supply voltage; a first data input terminal; a first transistor connected between the first data input terminal and the input node of the first inverter and having its gate to which a first clock signal is supplied; a second data input terminal; a second transistor connected between the second data input terminal and the input node of the second inverter and having its gate to which the first clock signal is supplied; a second power supply node; a third transistor connected between the common node and the second power supply node and having its gate to which a second clock signal complementary to the first clock signal is supplied; a first data output terminal connected to the output node of the first inverter; and the second data output terminal connected to the output node of the second inverter. The first clock signal for one of the latch circuits is complementary to the first clock signal for another one of latch circuits adjacent to the one latch circuit.

An advantage of the present invention is accordingly reduction of the number of necessary elements and of an occupied area of a circuit for a latch circuit or a flip-flop circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11A–11C are timing charts each showing an operation of the flip-flop circuit shown in FIG. 9.

FIG. 12 is a circuit diagram showing a structure of a conventional latch circuit.

FIGS. 13A–13C are timing charts each showing an operation of the latch circuit shown in FIG. 12.

FIG. 14 is a circuit diagram showing a structure of a conventional buffer circuit.

DESCRIPTION OF THE PREFERRED EMBODIMENTS

Figure 1:
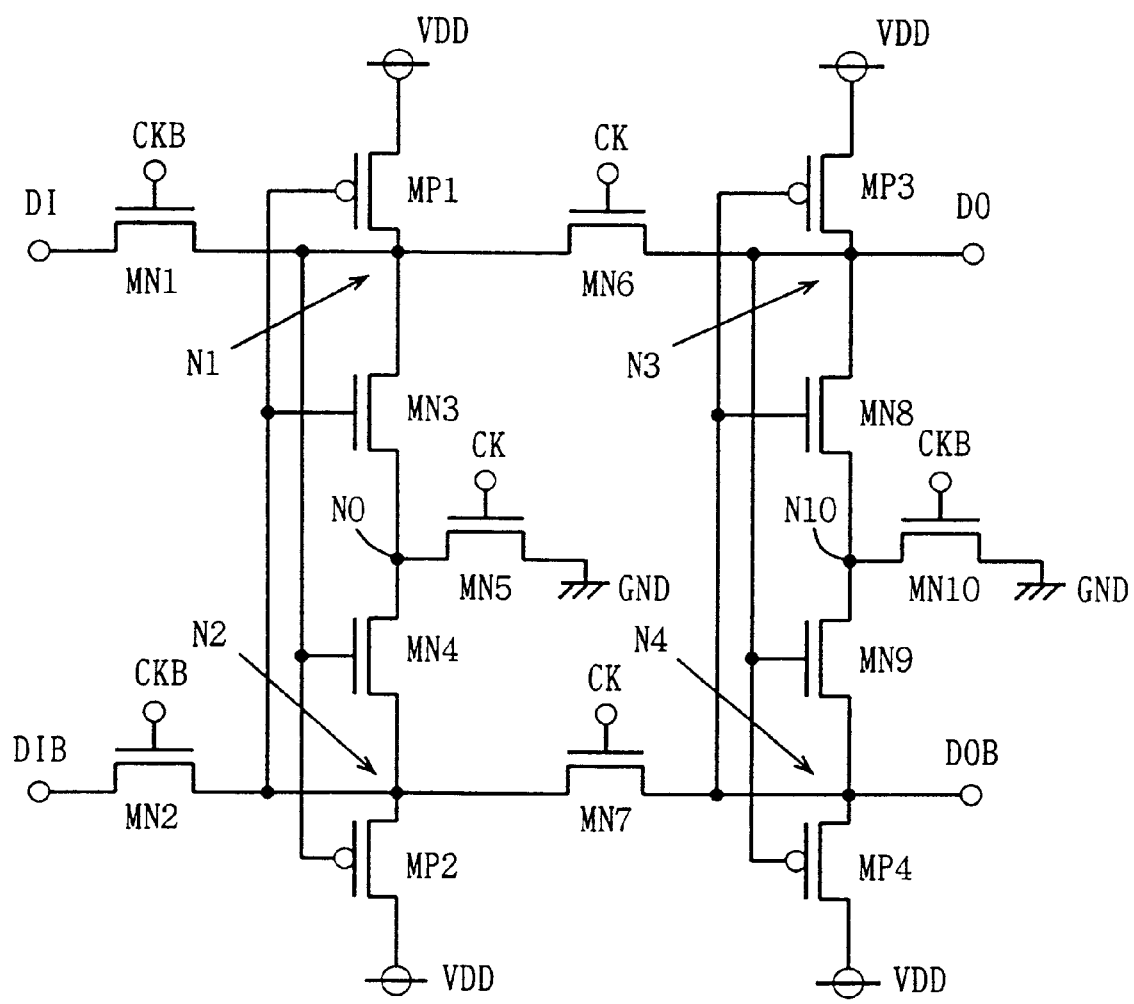
FIG. 1 is a circuit diagram showing a structure of a flip-flop circuit according to the first embodiment of the invention.

Embodiments of the present invention are hereinafter described in detail referring to figures. The same reference characters in the drawings denote the same or corresponding components.

First Embodiment

FIG. 1 is a circuit diagram showing a structure of a flip-flop circuit according to the first embodiment of the invention.

Referring to FIG. 1, the flip-flop circuit includes: a first data input terminal DI; a node N1; an N channel MOS transistor MN1 connected between the first data input terminal DI and node N1 and receiving a signal at its gate which is supplied to a second clock input terminal CKB (hereinafter referred to as "clock signal CKB"); a power supply voltage node VDD; a node N2; a P channel MOS transistor MP1 connected between power supply voltage node VDD and node N1 and having its gate connected to node N2; a node N0; an N channel MOS transistor MN3 connected between node N0 and node N1 and having its gate connected to node N2; a ground node GND; an N channel MOS transistor MN5 connected between node N0 and ground node GND and receiving a signal at its gate which is supplied to a first clock input terminal CK (hereinafter referred to as "clock signal CK"); an N channel MOS transistor MN4 connected between node N0 and node N2 and having its gate connected to node N1; a P channel MOS transistor MP2 connected between node N2 and supply voltage node VDD and having its gate connected to node N1; a second data input terminal DIB; an N channel MOS transistor MN2 connected between the second data input terminal DIB and node N2 and having its gate to which clock signal CKB is supplied; a node N3; an N channel MOS transistor MN6 connected between node N1 and node N3 and having its gate to which clock signal CK is supplied; a node N4; an N channel MOS transistor MN7 connected between node N2 and node N4 and having its gate to which clock signal CK is supplied; a first data output terminal DO connected to node N3; a P channel MOS transistor MP3 connected between supply voltage node VDD and node N3 and having its gate connected to node N4; a node N10; an N channel MOS transistor MN8 connected between node N3 and node N10 and having its gate connected to node N4; an N channel MOS transistor MN10 connected between ground node GND and node N10 and having its gate to which clock signal CKB is supplied; an N channel MOS transistor MN9 connected between node N10 and node N4 and having its gate connected to node N3; a second data output terminal DOB connected to node N4; and a P channel MOS transistor MP4 connected between node N4 and supply voltage node VDD and having its gate connected to node N3.

The flip-flop circuit therefore includes two cascaded latch circuits each having N channel MOS transistors MN1–MN5 or MN6–MN10 and P channel MOS transistors MP1, MP2 or MP3, MP4.

The flip-flop circuit further includes a buffer circuit shown in FIG. 14. An output terminal CKOB of the buffer circuit is connected to the gates of N channel MOS transistors MN1, MN2 and MN10. Another output terminal CKO is connected to the gates of N channel MOS transistors MN5–MN7. Therefore, clock signal CKB is complementary to clock signal CK.

Figure 2:
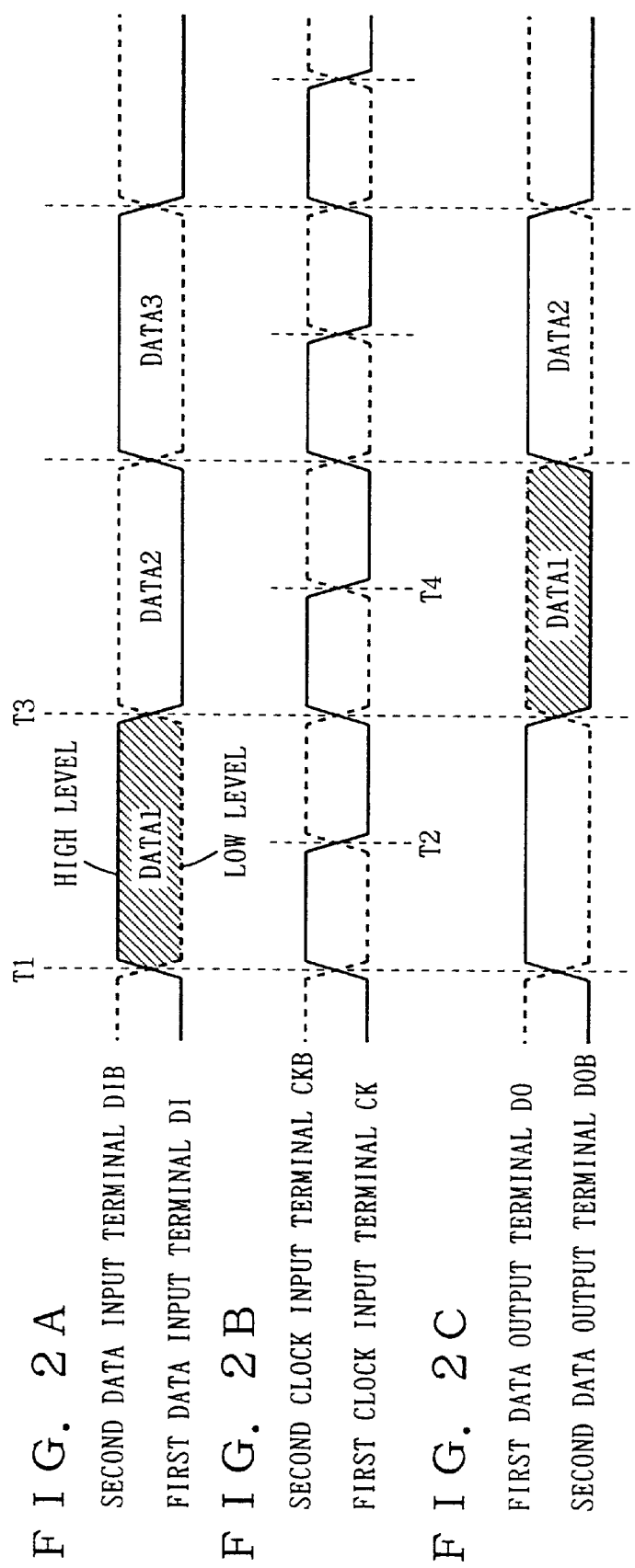
FIGS. 2A–2C are timing charts each showing an operation of the flip-flop circuit shown in FIG. 1.

An operation of the flip-flop circuit is described referring to the timing charts of FIGS. 2A–2C.

At time T1, a signal at a high level (supply voltage) is applied to the first data input terminal DI, and a signal at a low level (ground voltage) is applied to the second data input terminal DIB.

The signals applied to the first and second data input terminals DI and DIB are here referred to as the first data DATA1. At this time, if a high level signal and a low level signal are respectively applied to the first and second clock input terminals CK and CKB, N channel MOS transistors MN1 and MN2 are turned off and N channel MOS transistors MN5–MN7 are turned on. N channel MOS transistor MN10 is turned off. At time T2, if the signal applied to the first clock input terminal CK goes down to the low level and the signal applied to the second clock input terminal CKB goes up to the high level, N channel MOS transistors MN1 and MN2 are turned on. If the threshold voltage of the N channel MOS transistor is Vthn, the voltage on node N1 is the one which is lower than supply voltage by threshold voltage Vthn, and node N2 is at the low level. At this time, since the gate terminal of P channel MOS transistor MP1 is connected to node N2, P channel MOS transistor MP1 is turned on and the drain terminal of P channel MOS transistor MP1 or node N1 is boosted to the supply voltage level. On the other hand, the gate terminal of P channel MOS transistor MP2 is connected to node N1 and P channel MOS transistor MP2 is turned off. Accordingly, node N2 is set to the low level and node N1 is set to the high level. At this time, N channel MOS transistors MN5–MN7 are turned off and N channel MOS transistor MN10 is turned on.

Referring to FIG. 2A, at time T3, the signal applied to the first data input terminal DI goes down to the low level and the signal applied to the second data input terminal DIB attains the high level. The signals applied to the first and second data input terminals DI and DIB are here referred to as the second data DATA2. Simultaneously, if the signal supplied to the first clock input terminal CK attains the high level and the signal supplied to the second clock input terminal CKB goes down to the low level, the second data DATA2 supplied to the first and second data input terminals DI and DIB is separated from an internal circuit since N channel MOS transistors MN1 and MN2 are turned off. At this time, N channel MOS transistor MN5 is turned on. Consequently, the first data DATA1 is retained by a closed loop latch circuit constituted of an inverter gate formed of P channel MOS transistor MP1 and N channel MOS transistor MN3 and an inverter gate formed of P channel MOS transistor MP2 and N channel MOS transistor MN4.

At this time, N channel MOS transistors MN6 and MN7 are turned on. Accordingly, node N3 is at a voltage lower than the supplied voltage by the threshold voltage of N channel MOS transistor MN6, and node N4 is at the low level (ground voltage). Since the gate terminal of P channel MOS transistor MP3 is connected to node N4, P channel MOS transistor MP3 is turned on and the drain terminal of P channel MOS transistor MP3 or node N3 is boosted to the supply voltage. P channel MOS transistor MP4 is turned off since its gate terminal is connected to node N3. Consequently, a high level signal and a low level signal are respectively output from the first and second data output terminals DO and DOB.

Accordingly, the first data DATA1 is output via the first and second data output terminals DO and DOB.

At time T4, if the signal applied to the first clock input terminal CK goes down to the low level and the signal applied to the second clock input terminal CKB goes up to the high level, N channel MOS transistors MN1 and MN2 are turned on to set node N2 at voltage lower than the supply voltage by the threshold voltage of N channel MOS transistor MN2 and set node N1 to the low level. At this time, since the gate terminal of P channel MOS transistor MP2 is connected to node N1, P channel MOS transistor MP2 is turned on and the drain terminal of P channel MOS transistor MP2 or node N2 is boosted to the supply voltage level. P channel MOS transistor MP1 is turned off since its gate terminal is connected to node N2. Consequently, the second data DATA2 is taken. N channel MOS transistors MN5–MN7 are turned off and N channel MOS transistor MN10 is turned on. Since the gate terminal of P channel MOS transistor MP3 is connected to node N4, P channel MOS transistor MP3 is turned on and the drain terminal of P channel MOS transistor MP3 or the first data output terminal DO attains the high level. P channel MOS transistor MP4 is turned off since its gate terminal is connected to node N3. The first and second data output terminals DO and DOB respectively output a high level signal and a low level signal continuously, and the first data DATA1 is retained by a closed loop latch circuit constituted of an inverter gate formed of P channel MOS transistor MP3 and N channel MOS transistor MN8 and an inverter gate formed of P channel MOS transistor MP4 and N channel MOS transistor MN9.

The flip-flop circuit described above has a function of taking data signals applied to the first and second data input terminals DI and DIB synchronously with clock signals, retaining them temporarily, and outputting with their phase shifted.

The signal applied to the first data input terminal DI changes its state from the high level to the low level and the signal applied to the second data input terminal DIB changes its state from the low level to the high level as described above. This operation is similar after time T4.

Figure 9:
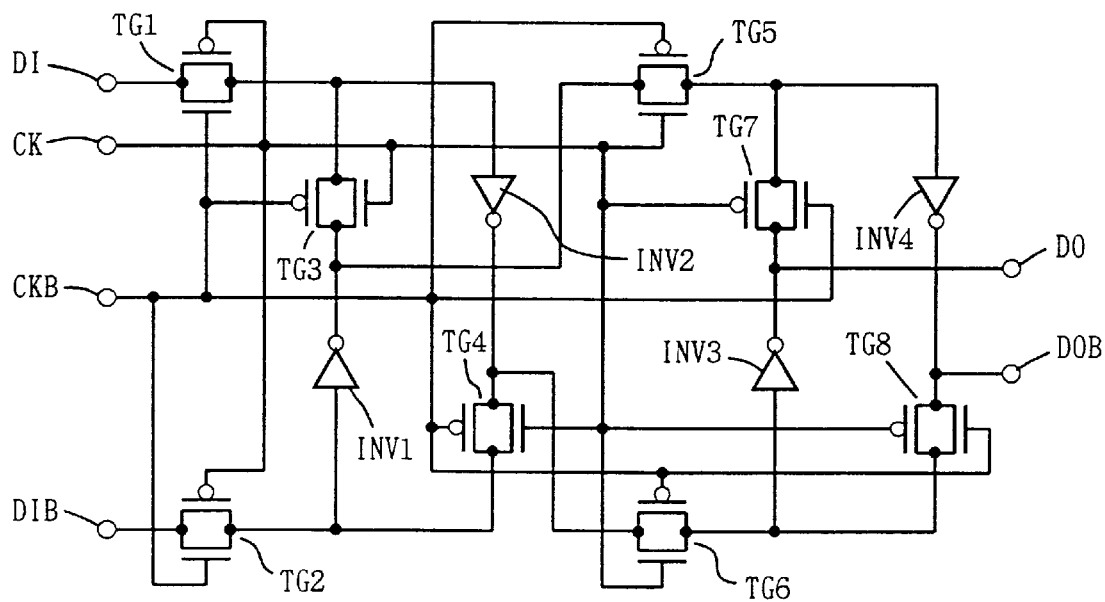
FIG. 9 is a circuit diagram showing a structure of a conventional flip-flop circuit.
Figure 10:
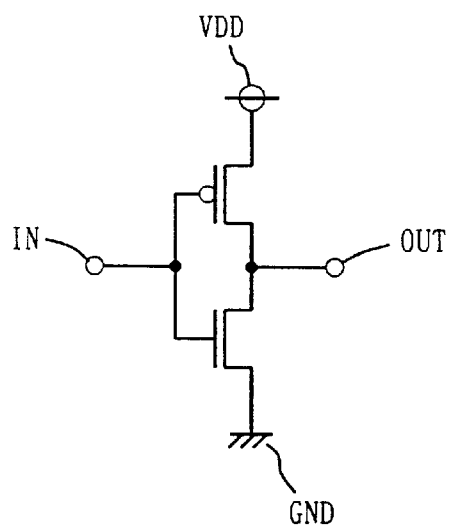
FIG. 10 is a circuit diagram showing a structure of an inverter gate shown in FIG. 9.

The flip-flop circuit according to this embodiment achieves reduction of the number of necessary elements and reduction of an occupied area compared with the conventional flip-flop circuit shown in FIG. 9. In addition, the number of transistors driven by a circuit which buffers a clock signal shown in FIG. 14 is also reduced and the power consumption of the buffer circuit can be reduced.

Second Embodiment

Figure 3:
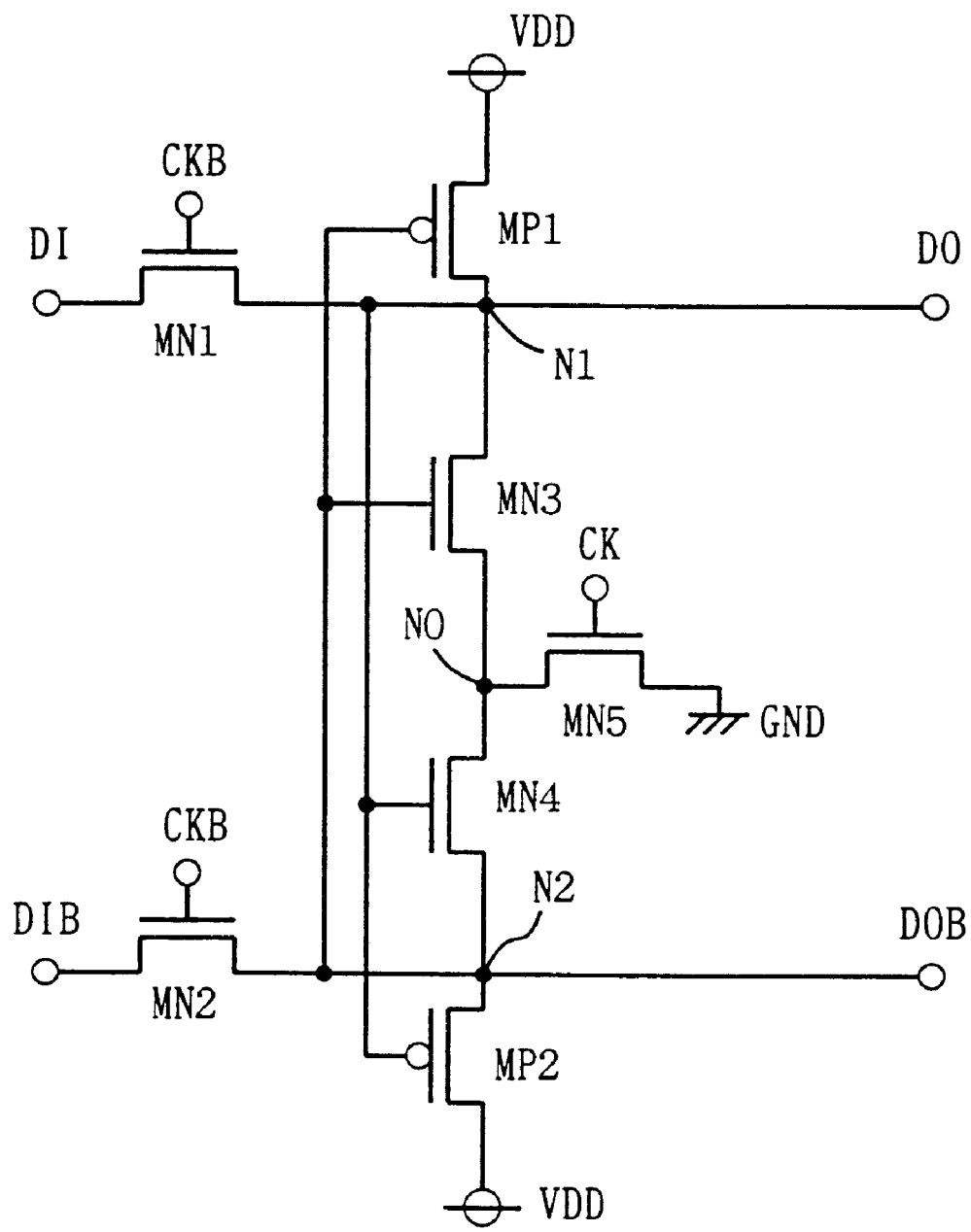
FIG. 3 is a circuit diagram showing a structure of a latch circuit according to the second embodiment of the invention.

FIG. 3 shows a structure of a latch circuit according to the second embodiment of the invention. Referring to FIG. 3, the latch circuit has the same structure as that of one latch circuit in the flip-flop circuit shown in FIG. 1. However, the first data output terminal DO is connected to node N1 and the second data output terminal DOB is connected to node N2.

An operation of the latch circuit is hereinafter described referring to the timing charts of FIGS. 4A–4C. At time T1, a signal at the high level is input to the first data input terminal DI, and a signal at the low level is input to the second data input terminal DIB. The signals supplied to the first and second data input terminals DI and DIB are here referred to as the first data DATA1. At this time, if a high level signal and a low level signal are respectively supplied to the first and second clock input terminals CK and CKB, N channel MOS transistors MN1 and MN2 are turned off and N channel MOS transistor MN5 is turned on.

At time T2 when the signal supplied to the first clock input terminal CK goes down to the low level and the signal supplied to the second clock input terminal CKB attains the high level, N channel MOS transistors MN1 and MN2 are turned on. If the threshold voltage of N channel MOS transistor MN1 is Vthn, the first data output terminal DO is at a voltage lower than the supply voltage by threshold voltage Vthn and the second data output terminal DOB is at the low level. At this time, since the gate terminal of P channel MOS transistor MP1 is connected to the second data output terminal DOB, P channel MOS transistor MP1 is turned on and the drain terminal of P channel MOS transistor MP1 or the first data output terminal DO is boosted to the supply voltage level. Consequently, the first data DATA1 is output from the first and second data output terminals DO and DOB as shown in FIG. 4C.

Figure 4:
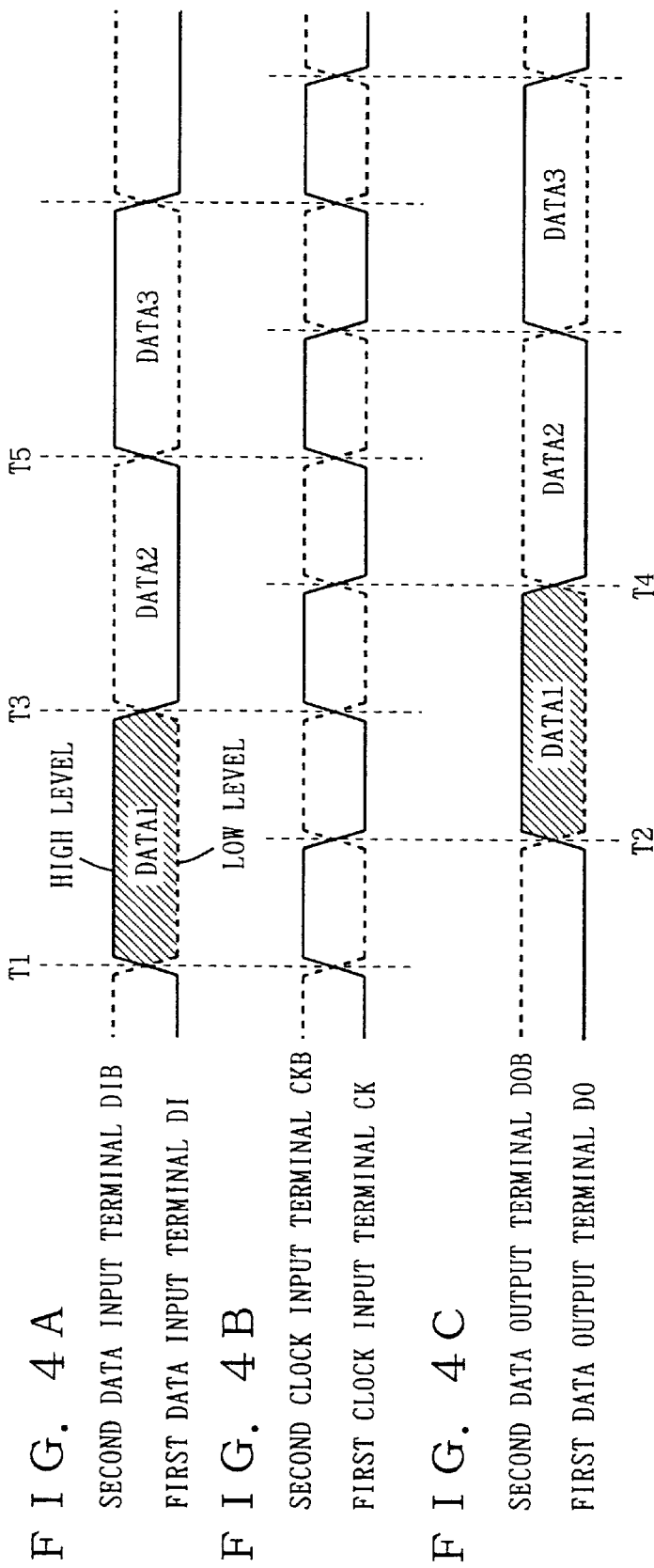
FIGS. 4A–4C are timing charts each showing an operation of the latch circuit shown in FIG. 3.

At time T3, the signal supplied to the first data input terminal DI goes down to the low level and the signal supplied to the second data input terminal DIB goes up to the high level as shown in FIG. 4A. The signals supplied to the first and second data input terminals are here referred to as the second data DATA2. Simultaneously, if the signal supplied to the first clock input terminal CK attains the high level and the signal supplied to the second clock input terminal CKB goes down to the low level, the second data DATA2 supplied to the first and second data input terminals DI and DIB is separated from the first and second data output terminals DO and DOB since N channel MOS transistors MN1 and MN2 are turned off. N channel MOS transistor MN5 is turned on. Accordingly, the first data DATA1 is retained by a closed loop latch circuit constituted of an inverter gate formed of P channel MOS transistor MP1 and N channel MOS transistor MN3 and an inverter gate formed of P channel MOS transistor MP2 and N channel MOS transistor MN4.

At time T4, if the signal supplied to the first clock input terminal CK goes down to the low level and the signal supplied to the second clock input terminal CKB attains the high level, N channel MOS transistors MN1 and MN2 are turned on. Accordingly, the second data output terminal DOB is at a voltage lower than the supply voltage by the threshold voltage of N channel MOS transistor MN2 and the first data output terminal DO is set to the low level. P channel MOS transistor MP2 is turned on since the gate terminal thereof is connected to node N1, and the drain terminal of P channel MOS transistor MP2 or the second data output terminal DOB is boosted to the high level (supply voltage). P channel MOS transistor MP1 is turned off since its gate terminal is connected to node N2. The first data output terminal DO and the second data output terminal DOB thus output the low level signal and the high level signal respectively and thus the second data DATA2 is output.

The latch circuit according to this embodiment thus has a function of taking data signals applied to the first and second data input terminals DI and DIB in synchronism with clock signals applied to the first and second clock input terminals, temporarily retaining them and outputting with their phase shifted.

According to the description of the operation above, the signal applied to the first data input terminal DI changes its state from the high level to the low level, and the signal applied to the second data input terminal DIB changes its state from the low level to the high level from time T1 to time T4. The operation is similar after time T4.

The latch circuit according to this embodiment thus has a reduced number of necessary elements and achieves reduction of an occupied area compared with the conventional latch circuit shown in FIG. 12. Further, the number of transistors driven by a circuit which buffers a clock signal (clock driver) shown in FIG. 14 is also decreased and power consumption of the clock driver can be reduced.

Third Embodiment

Figure 5:
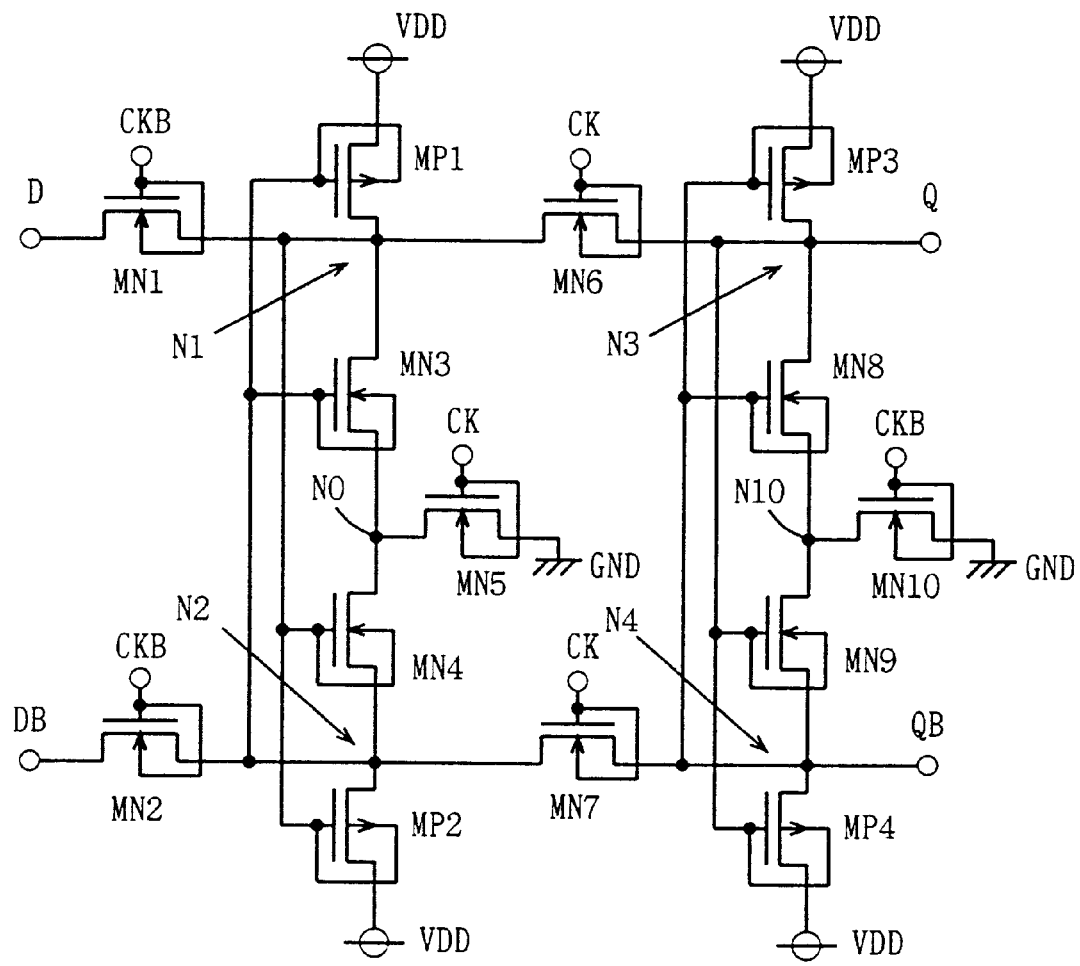
FIG. 5 is a circuit diagram showing a structure of a flip-flop circuit according to the third embodiment of the invention.

FIG. 5 is a circuit diagram showing a structure of a flip-flop circuit according to the third embodiment of the invention. Referring to FIG. 5, the flip-flop circuit has a structure similar to that of the flip-flop circuit of the first embodiment shown in FIG. 1. A difference is that a gate terminal and a back gate terminal of each of all the transistors constituting the flip-flop circuit are connected. According to the first embodiment, back gate terminals of P channel MOS transistors MP1–MP4 constituting the flip-flop circuit may be connected to the power supply voltage node, and back gate terminals of N channel MOS transistors MN1–MN10 constituting the flip-flop circuit may be connected to the ground voltage node.

In the flip-flop circuit of this embodiment, the threshold voltage of each transistor as a component thereof is decreased to increase driving power and operation speed.

An operation of the circuit of this embodiment is similar to the flip-flop circuit of the first embodiment.

Fourth Embodiment

Figure 6:
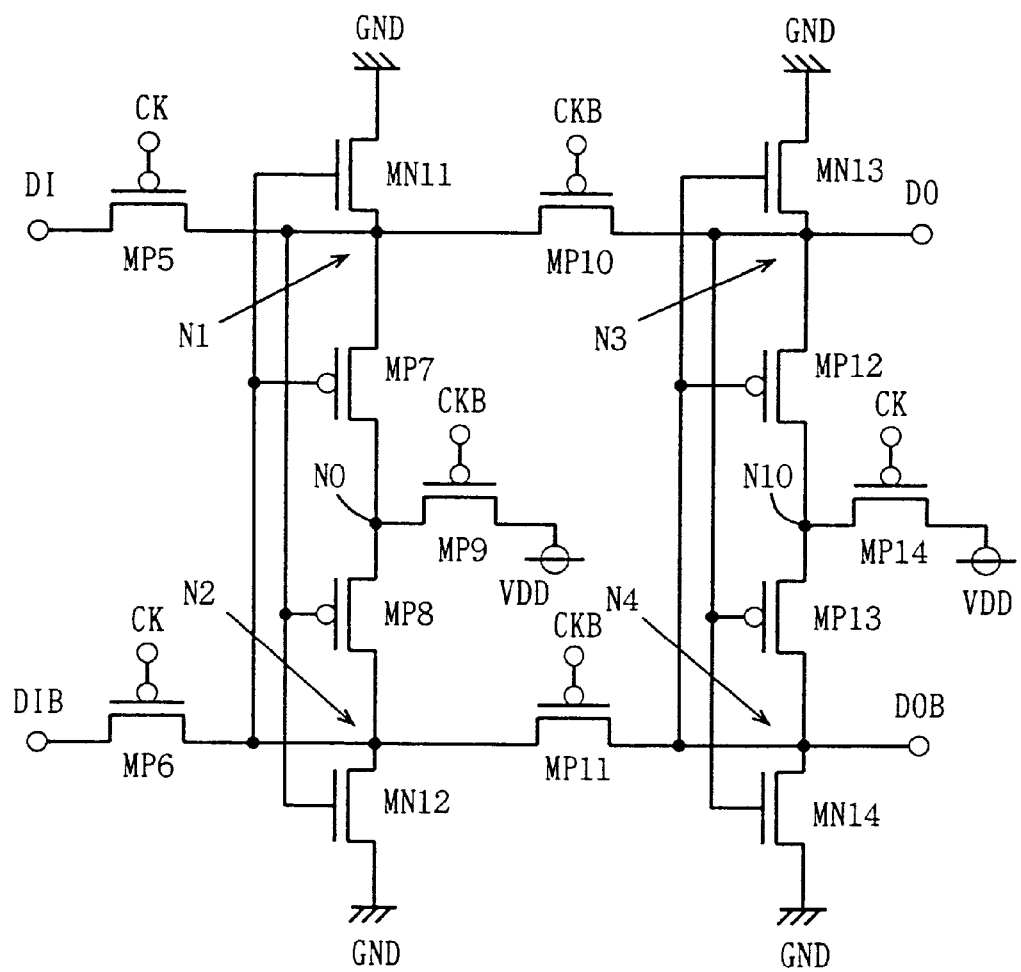
FIG. 6 is a circuit diagram showing a structure of a flip-flop circuit according to the fourth embodiment of the invention.

FIG. 6 is a circuit diagram showing a structure of a flip-flop circuit according to the fourth embodiment of the invention. Referring to FIG. 6, the flip-flop circuit has a structure similar to that of the flop-flop circuit of the first embodiment. A difference is that the polarity is totally inverted.

Specifically, P channel MOS transistors are used instead of N channel MOS transistors, and N channel MOS transistors are employed instead of P channel MOS transistors. In addition, the ground node and the supply voltage node are interchanged with each other. A clock signal supplied to the gate of each transistor has an inverted level.

The flip-flop circuit according to this embodiment having such a structure as described above also implements an operation similar to the flip-flop circuit of the first embodiment.

If two flip-flop circuits are used, the number of necessary N channel MOS transistors and that of necessary P channel MOS transistors are appropriately balanced by combining the flip-flop circuit of the first embodiment and the flip-flop circuit of this embodiment. As a result, an efficient layout is achieved. This advantage is hereinafter described specifically.

Figure 7:
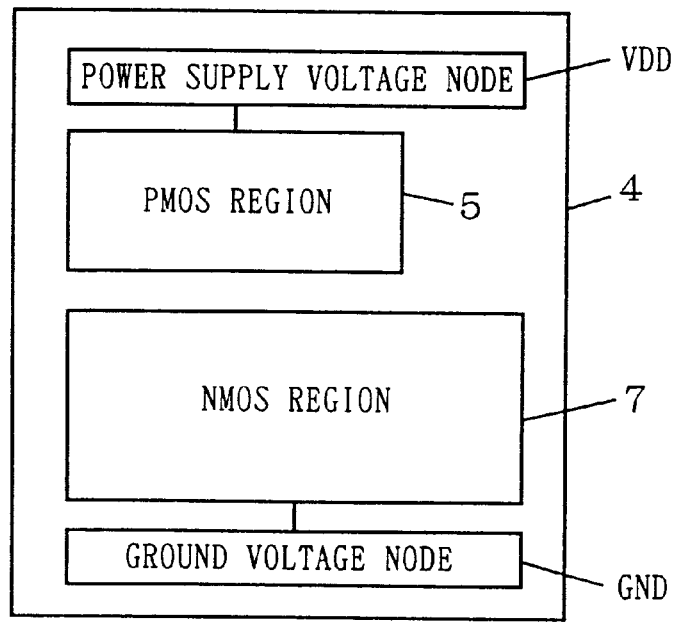
FIG. 7 shows a layout of the flip-flop circuit shown in FIG. 1.

FIG. 7 shows a layout of the flip-flop circuit according to the first embodiment shown in FIG. 1. Referring to FIG. 7, the flip-flop circuit is formed on a cell 4, and cell 4 includes a power supply voltage node VDD, a ground voltage node GND, a P channel MOS region 5 connected to power supply voltage node VDD and having four (4) P channel MOS transistors, and an NMOS region 7 connected to ground voltage node GND and having ten (10) N channel MOS transistors.

On the other hand, the flip-flop circuit according to the fourth embodiment includes ten (10) P channel MOS transistors and four (4) N channel MOS transistors. Therefore, the PMOS region of the flip-flop circuit is relatively larger than the NMOS region contrary to the flip-flop circuit of the first embodiment.

Figure 8:
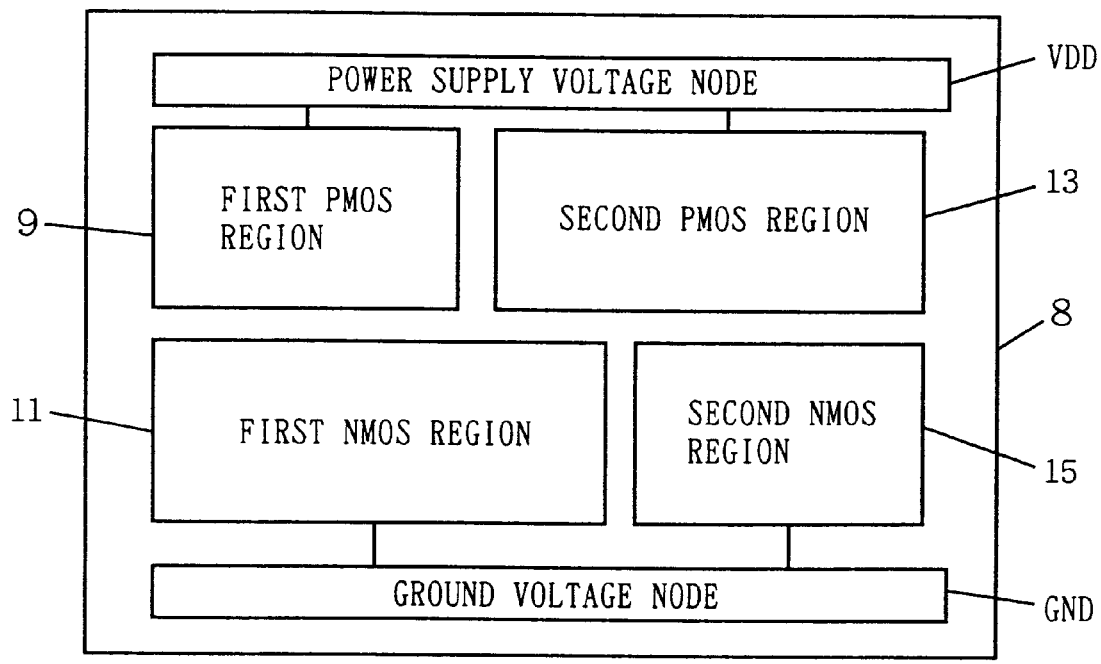
FIG. 8 shows a layout of a circuit formed by combining the flip-flop circuit of FIG. 1 with the flip-flop circuit of FIG. 6.

FIG. 8 shows a layout of a circuit formed by combining the flip-flop circuit of the first embodiment and that of the fourth embodiment. Referring to FIG. 8, the flip-flop circuit according to the first embodiment is constituted of supply voltage node VDD, a first PMOS region 9, a first NMOS region 11 and ground voltage node GND, and the flip-flop circuit of the fourth embodiment is constituted of supply voltage node VDD, a second PMOS region 13, a second NMOS region 15 and ground voltage node GND.

The area of a cell 8 can be reduced further by combining the flip-flop circuits of the first and fourth embodiments compared with the case shown in FIG. 7 in which only the flip-flop circuits of the first embodiment are cascaded, and an efficient layout is thus achieved.

Furthermore, the latch circuit including MOS transistors MN6–MN10, MP3, and MP4 shown in FIG. 1 can be replaced with the latch circuit including MOS transistors MP10–MP14, MN13, and MN14 shown in FIG. 6. Contrarily, the latch circuit including MOS transistors MN1–MN5, MP1, and MP2 shown in FIG. 1 can be replaced with the latch circuit including MOS transistors MP5–MP9, MN11, and MN12 shown in FIG. 6.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A latch circuit comprising:

a common node;

a first power supply node;

a first inverter connected between said common node and said first power supply node;

a second inverter connected between said common node and said first power supply node, having an input node connected to an output node of said first inverter, and having an output node connected to an input node of said first inverter;

a first data input terminal;

a first transistor connected between said first data input terminal and the input node of said first inverter and having its gate to which a first clock signal is supplied;

a second data input terminal;

a second transistor connected between said second data input terminal and the input node of said second inverter and having its gate to which said first clock signal is supplied;

a second power supply node;

a third transistor connected between said common node and said second power supply node and having its gate to which a second clock signal which is complementary to said first clock signal is supplied;

a first data output terminal connected to the output node of said first inverter; and a second data output terminal connected to the output node of said second inverter.

2. The latch circuit according to claim 1, wherein said first to said third transistors are N channel MOS transistors, said first power supply node has power supply voltage, and said second power supply node has ground voltage.

3. The latch circuit according to claim 1, wherein said first to said third transistors are P channel MOS transistors, said first power supply node has ground voltage and said second power supply node has power supply voltage.

4. The latch circuit according to claim 1, wherein said first to said third transistors are each has its gate and back gate connected to each other, and each of transistors included in said first and second inverters has its gate and back gate connected to each other.

5. The latch circuit according to claim 1, further comprising means for generating said first clock signal and said second clock signal.

6. A flip-flop circuit comprising a plurality of cascaded latch circuits each including:

a common node;

a first power supply node;

a first inverter connected between said common node and said first power supply node;

a second inverter connected between said common node and said first power supply node, having an input node connected to an output node of said first inverter, and having an output node connected to an input node of said first inverter;

a first data input terminal;

a first transistor connected between said first data input terminal and the input node of said first inverter and having its gate to which a first clock signal is supplied;

a second data input terminal;

a second transistor connected between said second data input terminal and the input node of said second inverter and having its gate to which said first clock signal is supplied;

a second power supply node;

a third transistor connected between said common node and said second power supply node and having its gate to which a second clock signal which is complementary to said first clock signal is supplied;

a first data output terminal connected to the output node of said first inverter; and a second data output terminal connected to the output node of said second inverter.

7. The flip-flop circuit according to claim 6, wherein said first to said third transistors are N channel MOS transistors, said first power supply node has power supply voltage, and said second power supply node has ground voltage.

8. The flip-flop circuit according to claim 6, wherein said first to said third transistors are P channel MOS transistors, said first power supply node has ground voltage, and said second power supply node has power supply voltage.

9. The flip-flop circuit according to claim 6, wherein said first to said third transistors each has its gate and back gate connected to each other, and each of transistors included in said first and second inverters has its gate and back gate connected to each other.

10. The flip-flop circuit according to claim 6, wherein said first to said third transistors included in at least one of said latch circuits are N channel MOS transistors, said first power supply node has power supply voltage, and said second power supply node has ground voltage, or said first to said third transistors included in at least another one of said latch circuits are P channel MOS transistors, said first power supply node has ground voltage, and said second power supply node has power supply voltage.

11. The flip-flop circuit according to claim 6, further comprising means for generating said first clock signal and said second clock signal.

* * * * *

UNITED STATES PATENT AND TRADEMARK OFFICE
CERTIFICATE OF CORRECTION

PATENT NO. : 5,994,935

DATED : November 30, 1999

INVENTOR(S) : Kimio Ueda, et al.

It is certified that error appears in the above-identified patent and that said Letters Patent is hereby corrected as shown below:

Column 12, line 32, delete "are".

Signed and Sealed this

Twenty-ninth Day of August, 2000

Attest:

Q. TODD DICKINSON

*Attesting Officer*   *Director of Patents and Trademarks*